United States Patent [19]
Sudo

[11] Patent Number: 6,094,374
[45] Date of Patent: Jul. 25, 2000

[54] NONVOLATILE SEMICONDUCTOR MEMORY DEVICE INCLUDING SENSE AMPLIFIER HAVING VERIFICATION CIRCUIT

[75] Inventor: Naoaki Sudo, Tokyo, Japan

[73] Assignee: NEC Corporation, Tokyo, Japan

[21] Appl. No.: 09/272,344

[22] Filed: Mar. 19, 1999

[30] Foreign Application Priority Data

Mar. 25, 1998  [JP]  Japan .................................. 10-076372

[51] Int. Cl.⁷ ................................................ G11C 16/06
[52] U.S. Cl. ............................... 365/185.22; 365/185.21; 365/185.24
[58] Field of Search ......................... 365/185.03, 185.21, 365/185.22, 185.24

[56] References Cited

U.S. PATENT DOCUMENTS

| | | | |
|---|---|---|---|
| 5,422,842 | 6/1995 | Cernea et al. ........................... | 365/185 |
| 5,513,193 | 4/1996 | Hashimoto ........................... | 365/185.22 |
| 5,521,864 | 5/1996 | Kobayashi et al. .................. | 365/185.22 |
| 5,539,690 | 7/1996 | Talreja et al. ....................... | 365/185.22 |
| 5,654,921 | 8/1997 | Sano .................................... | 365/185.24 |
| 5,666,308 | 9/1997 | Ota ...................................... | 365/185.05 |
| 5,684,741 | 11/1997 | Talreja ................................ | 365/185.22 |
| 5,867,427 | 2/1999 | Sato .................................... | 365/185.2 |

*Primary Examiner*—Son Mai
*Attorney, Agent, or Firm*—McGinn & Gibb, P.C.

[57] ABSTRACT

The object of the present invention is to reduce the dispersion of the threshold after writing while maintaining the high speed nature of a write system in a nonvolatile semiconductor memory such as a flash memory of channel hot electron write type. The feature of this invention is to provide a memory with a write current detection type write circuit and a sense amplifier for read, and to switch, for verification at the time of write, between verification by the write current type write circuit and verification of normal read mode which uses the sense amplifier for read. In other words, when a cell threshold of write level is designated as a first threshold and a specified threshold level lower than the first threshold is designated as a second threshold, write operation by the write current detection type write circuit is performed at the beginning of write mode, and stops the write operation when the current flowing between the drain and the source of the memory cell falls to below or equal to the reference current corresponding to the second threshold. Thereafter, the write operation is performed by repeating the write operation and verification operation using the sense amplifier until the cell threshold reaches the first threshold.

11 Claims, 9 Drawing Sheets

NONVOLATILE SEMICONDUCTOR MEMORY DEVICE INCLUDING SENSE AMPLIFIER HAVING VERIFICATION CIRCUIT

BACKGROUND OF THE INVENTION

1. Field of the Invention

The present invention relates to a semiconductor memory device, and more particularly to a nonvolatile semiconductor memory device such as a flash memory of channel hot electron write type.

2. Description of the Related Art

Up to the present, in a flash memory of channel hot electron type write system, the end point of write is determined by verifying through monitoring, at the time of write, the threshold voltage of the memory cell write current flowing between the drain and the source (drain current), as disclosed, for example, in U.S. Pat. No. 5,422,842.

Referring to FIG. 1 showing a conventional circuit, the situation mentioned above will be described in more detail. At the time of write, a voltage of, for example, 12V is supplied to the control gate of a cell transistor of a memory cell array 3 from a word signal line D. A write current detection type write circuit 2 supplies a drain voltage necessary for write, a voltage of 6V, for example, to the drain of a transistor 21. A comparator circuit 23 compares a current Icell (drain current) flowing between the drain and the source of a cell transistor of the memory cell array 3 due to the drain voltage against a reference current Iref for detecting the end of write. As the threshold voltage of the cell transistor falls with the progress in writing, the current Icell also falls until the current Icell becomes equal to the reference current Iref for detecting the end of write. The comparator circuit 23 detects this point as the end of write, and outputs a matching detection signal E. The signal E is input to a control circuit 4 to inactivate a write control signal A supplied to the gates of the transistors 21 and 22, and turns off the transistor 21 and 22 and turns on the transistor 24 to stop the writing.

The arrangement described above is referred to as the write current detection type write system. In this system, it is possible to perform writing at high speed since the need for providing a time for verifying the threshold voltage of the memory cell transistor, separately from the write time, can be eliminated as the drain current is monitored in parallel while writing is in progress.

However, in the conventional write current detection type write system, it is difficult to precisely match the detection time of an end of write with the actual time of a stop of write. Moreover, because of the high rate of write, overshoot in writing takes place corresponding to the mismatch between the detection time of the end of write and the actual time of the stop of write, which leads to a threshold voltage larger than a scheduled value, and gives rise to a drawback in that the dispersion in the threshold voltage after write has a large value.

Further, the verification of the threshold voltage is carried out concurrent with write, rather than done in accordance with the normal read mode. Accordingly, the conditions such as the voltages to be applied to the control gate and the drain of the memory cell transistor are different at the time of threshold detection and at the time of read, which may lead to the possibility of having a threshold different from the one necessary at the time of read.

Furthermore, according to this system, when data with the lowest threshold are to be written to a memory cell of a multilevel system with more than three levels, there also arises a problem of having a large dispersion in the threshold caused by the overshot writing due to the fast change in the write current. This is caused by the fact that the change in the write current is large in the initial stage and decreases gradually as writing proceeds.

SUMMARY OF THE INVENTION

It is the object of the present invention to provide, a in a nonvolatile semiconductor memory device such as a flash memory of channel hot electron write type, a nonvolatile semiconductor memory device which is capable of reducing the dispersion in the threshold after write while maintaining the high speed performance of the write current detection type write system.

According to this invention, it is possible to obtain a nonvolatile semiconductor memory device which comprises a nonvolatile semiconductor memory cell array, write current detection type write means which performs threshold verification while executing a write operation by monitoring the cell current at the time of write to a cell of the memory cell array, sense amplifier means for read which performs threshold verification of the memory cell while monitoring the on-current of the memory cell, and control means which performs, during the verification at the time of write, switching between the verification by the write current detection type write means and the verification by the sense amplifier means for read.

The write current detection type write means includes means which generates and supplies the writing cell current for the memory cell using a write voltage and a first comparator means which compares the writing cell current with a first predetermined reference value, and the control means performs a writing, by repeating the write operations by the write current detection type write means and the threshold verification by the sense amplifier means for read when matching by the first comparator means is detected.

Moreover, the sense amplifier means has a second comparator means which compares the on-current of the memory cell against a second predetermined reference value, the control means ends the writing operation in response to matching detection by the second comparator means of the sense amplifier means while performing writing by the repetition of the writing operation by the write current detection type means and the verifications by the sense amplifier means for read.

According to this invention, there can be obtained a nonvolatile semiconductor memory cell device which comprises a nonvolatile semiconductor memory cell array capable of performing multilevel write and read, write means which writes data to a cell of the memory cell array, sense amplifier means for read which performs threshold verification of the memory cell while monitoring the on-current of the memory cell, and control means which controls so as to write at least one value out of the multilevel thresholds by repeating writing by the write means and the verification operation by the sense amplifier means, then write the rest of the values other than the one value of the multilevel thresholds by the write means.

The sense amplifier means has comparator means which compares the read cell current against a reference value corresponding to the one value, and the control means controls so as to write the rest of the values other than the one value in response to the matching detection of the comparator means.

The write means has cell current supply means which generates and supplies a cell current for the memory cell according to the write voltage, and comparator means which compares the cell current against a predetermined reference values corresponding to the rest of the values other than the one value, and the control means causes the cell current supply means and the comparator means to operate at the time of writing the rest of the values other than the one value.

Now, the action of this invention will be described. This invention is provided with a write current detection type write circuit and a sense amplifier for read, and carries out, for the verification at the time of write, switching between the verification using the write current detection type write circuit and the verification by the normal read mode using the sense amplifier for read. Namely, when the cell threshold of the write level is set to be a first threshold, and a specified threshold lower than the first threshold is set to be a second threshold, the write operation by means of the write current detection type write circuit is performed at the beginning of the write mode, stops the write operation when the current flowing from the drain to the source of the memory cell falls to less than or equal to the reference current corresponding to the second threshold, then performs the write operation by repeating the write operation and the verification operation using the sense amplifier until the cell threshold reaches the first threshold.

In addition, in the case of a memory cell which performs write and read of multilevel thresholds, a plurality of write current detection type write circuits and at least one sense amplifier for read are provided. At the beginning of a write for the multilevel mode, writing is performed by repeating the write operation and the verification operation using the sense amplifier, and write operation using the write current detection type write circuits is carried out when the cell threshold arrives at the smallest reference voltage out of a plurality of reference voltages corresponding to respective levels of the multilevel.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
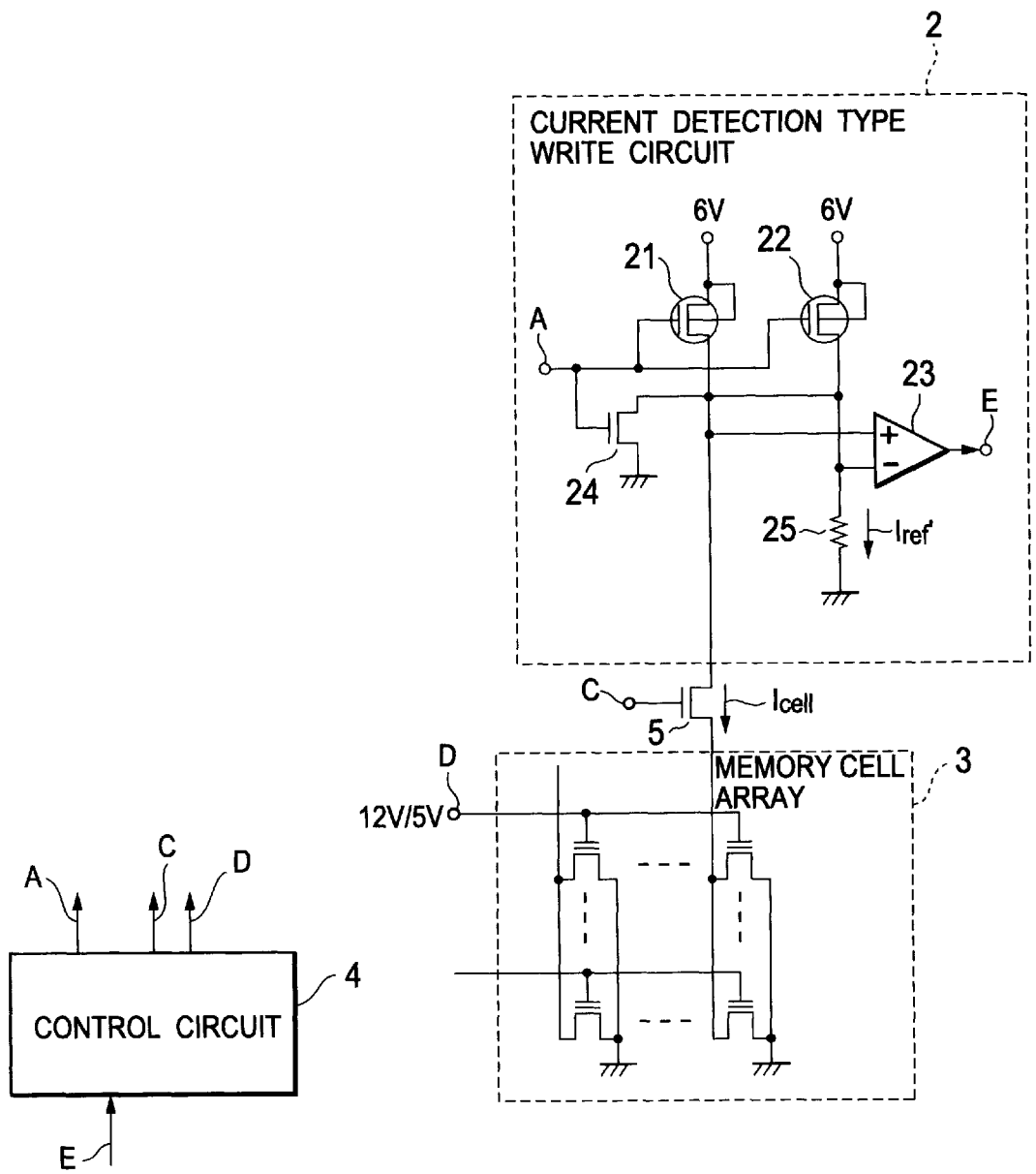
FIG. 1 is a circuit diagram of a conventional write current detection type write circuit.

Referring to the drawings, the embodiments of this invention will be described in the following.

Figure 2:
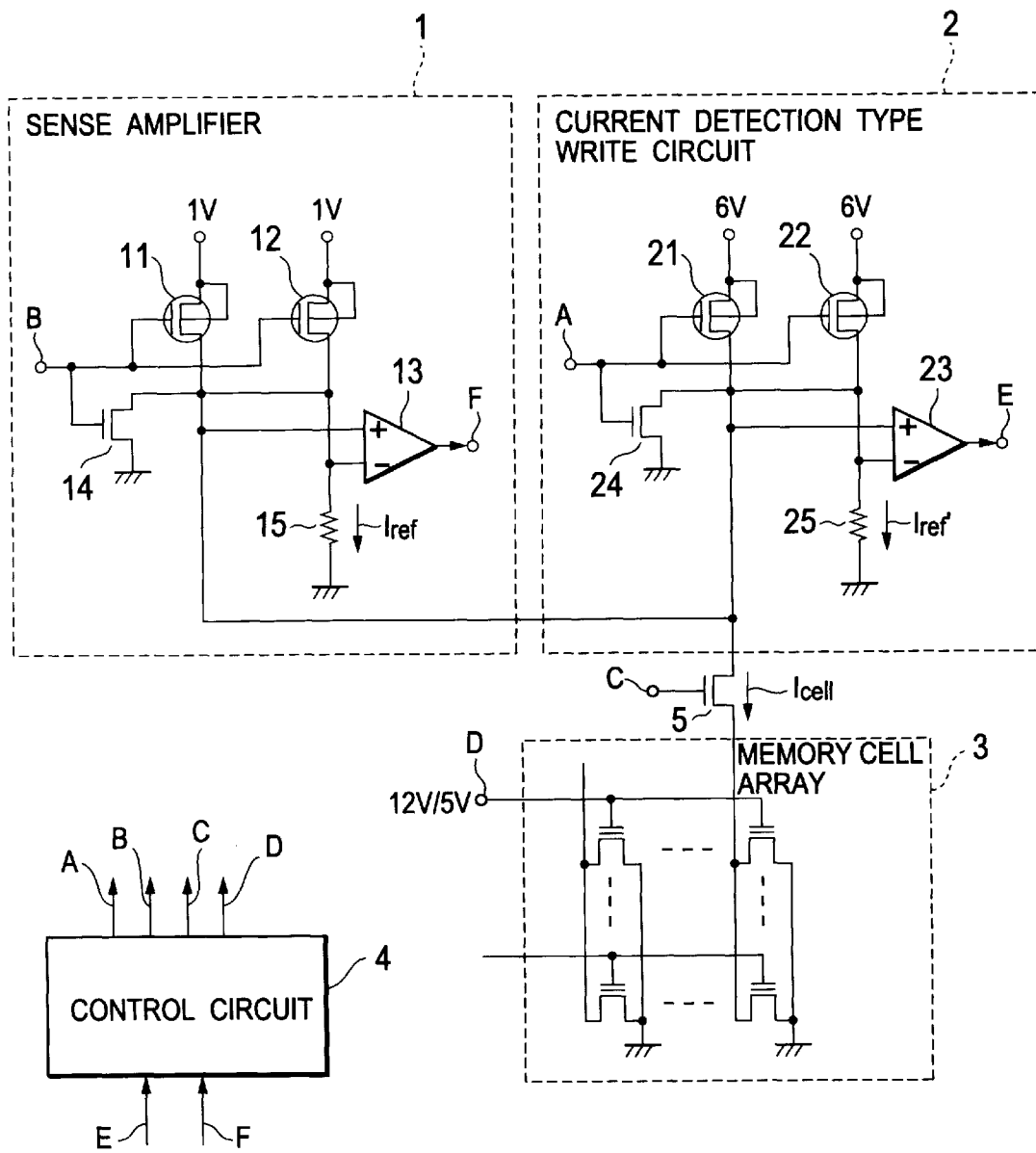
FIG. 2 is a circuit diagram of a first embodiment of the present invention.

FIG. 2 is a circuit diagram showing an embodiment of the present invention. This circuit has a configuration in which a write current detection type write circuit 2 and a sense amplifier 1 for read are connected to a memory cell array 3 of a nonvolatile semiconductor memory device. The write current detection type write circuit 2 supplies a drain voltage necessary for write, a voltage of, for example, about 6V, to the drain of a transistor 21. The circuit 2 has a comparator circuit 23 which compares a current Icell (drain current) due to the voltage source flowing between the drain and the source of a cell transistor in the memory cell array 3 against a reference current Iref at the time of write.

To describe in more detail, the circuit 2 comprises P-channel transistors 21 and 22, an N-channel transistor 24, a comparator circuit 23, and a resistor 25. The transistors 21 and 22 receive a write control signal A at their gates, and are turned on at the low active state of the write control voltage A. The transistor 21 generates a drain current Icell based on the write voltage of 6V, and the transistor 22 supplies the voltage of 6V to the resistor 25 to generate the reference voltage Iref' of the comparator circuit 23.

The transistor 24 receives the write control signal A to its gate and is turned on at the high level of the control signal A, and acts to clamp the drain outputs of the transistors 21 and 22 to zero. The comparator circuit 23 outputs a matching detection signal E when the drain current Icell and the reference current Iref' become equal.

Further, the sense amplifier 1 for read comprises a voltage source which supplies a drain voltage necessary for read, a voltage of, for example, 1V to the memory cell, and a comparator circuit 13 which compares the current Icell (on-current) flowing between the drain and the source of the memory cell transistor during the reading without writing against a reference current Iref for read.

To describe in more detail, the sense amplifier 1 comprises P-channel transistors 11 and 12, an N-channel transistor 14, and a resistor 15 which generates a reference current Iref of the comparator circuit 13. The transistors 11 and 12 receive a sense amplifier activation signal B to their gates, and are turned on by the low active level of the activation signal B. The transistor 11 supplies a read voltage of 1V to the drain of the cell transistor, and the transistor 12 supplies the voltage of 1V to the resistor 15 to generate the reference current Iref of the comparator circuit 13.

The transistor 14 receives the sense amplifier activation signal B to its gate, and is turned on by the high level of the signal B, and clamps the drain outputs of the transistors 11 and 12 to zero. When the comparator circuit 13 detects matching of the on-current Icell with the reference current Iref, it outputs a matching detection signal F.

The voltage source for write and the voltage source for read are supplied to the memory cell 3 via a column selection transistor 5. The column selection transistor 5 receives a column selection transistor selection signal C to its gate, and selectively connects the write current detection type write circuit 2 and the sense amplifier 1 to either one column of the memory cell array 3. The control gate of each cell of the memory cell array 3 is supplied with a voltage D of a word signal line of, for example, 12V at the time of write and 5V at the time of read.

In addition, the memory device is provided with a control circuit 4 which generates and outputs various kinds of signals A to D using the outputs E and F of the above circuits as the control inputs, and has the function of controlling the operation of the various circuits 1 to 3.

Figure 3:
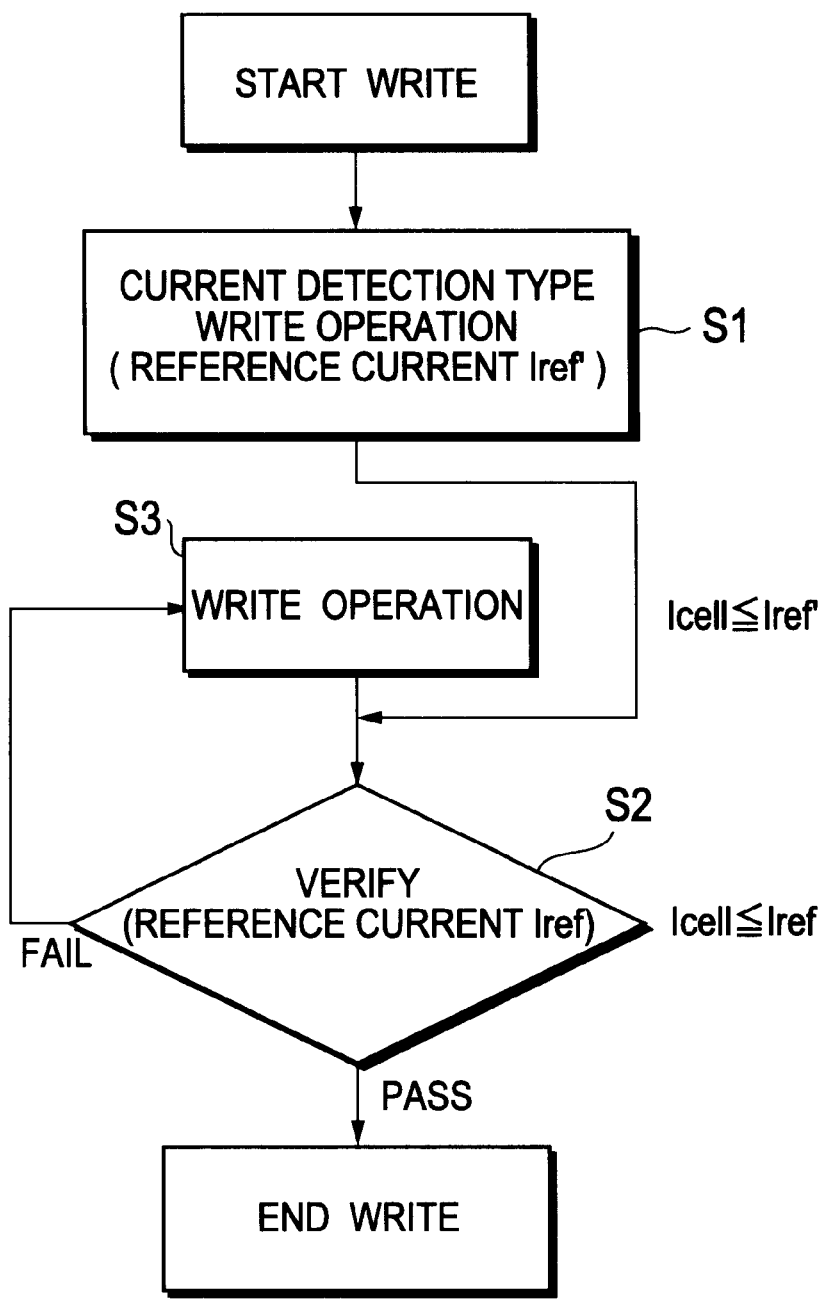
FIG. 3 is a flow chart showing the operation of the circuit in FIG. 1.
Figure 4:
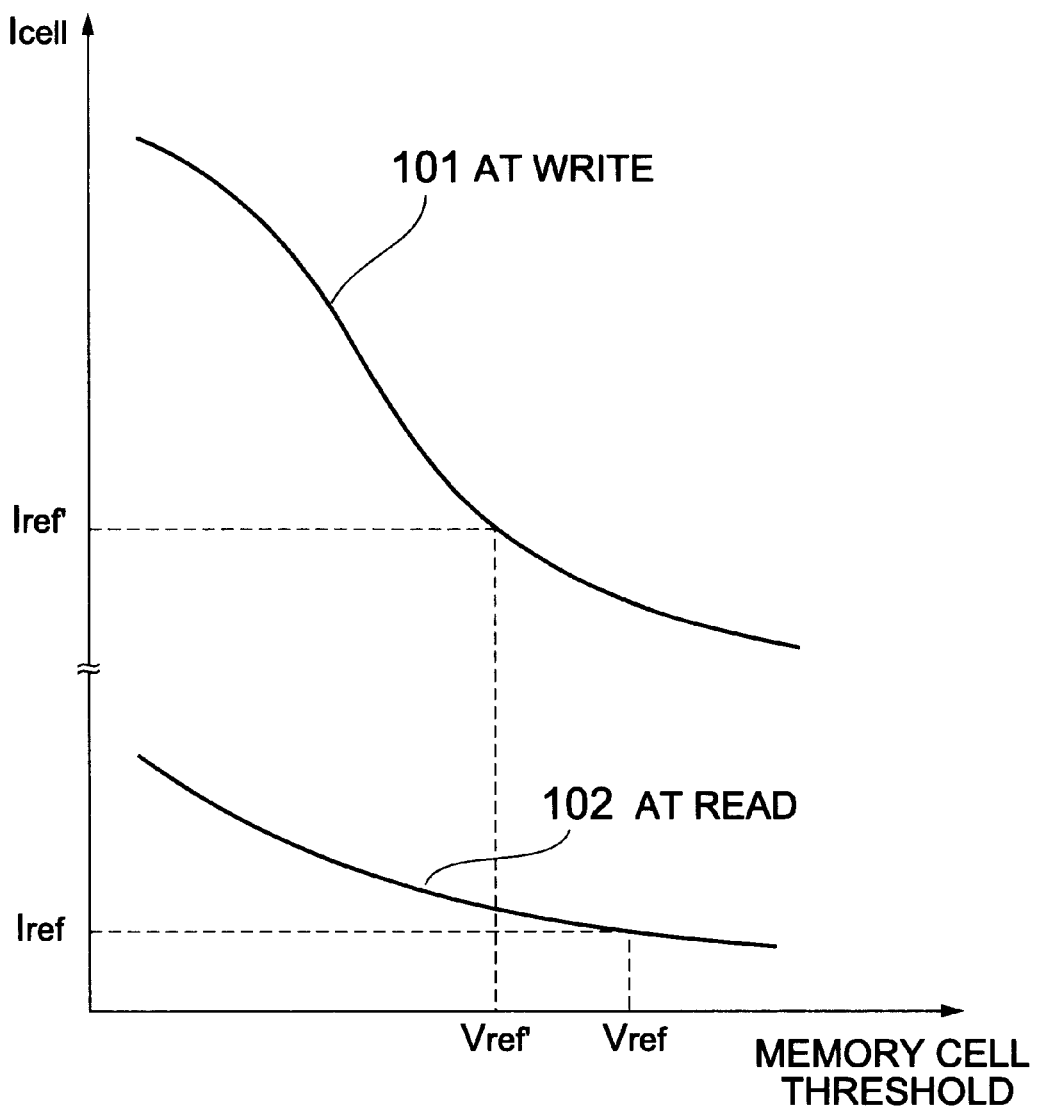
FIG. 4 is a diagram showing the dependence of the cell current Icell on memory cell threshold.
Figure 5:
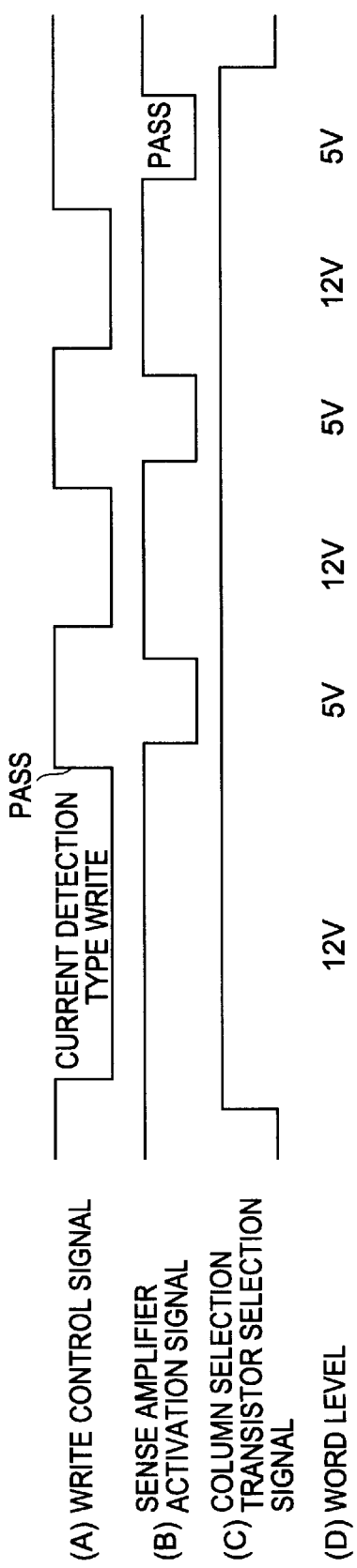
FIG. 5 is a diagram showing an example of a timing chart for various parts of the circuit in FIG. 2.

FIG. 3 is a flow chart showing the control operation of the control circuit 4 in the block diagram of FIG. 2. FIG. 4 is a diagram for showing the dependence of the cell current Icell on the cell threshold for the cases of write and read by the curves 101 and 102, respectively. FIG. 5 is an example of timings of the signals A to D. Referring to FIGS. 3 to 5, the operation of an embodiment of this invention will be described.

First, using the write current detection type write circuit 2, data are written until the drain current Icell of the transistor 21 falls below the reference current Iref' (corresponding to a threshold Vref' of the memory cell) (step S1). In the timing chart in FIG. 4, writing is performed until the timing indicated by "pass" in the curve for (A). In this case, the verification operation (verify operation) on the write threshold using the sense amplifier 1 for read is absent, so the write takes a short time.

Next, the verification operation using the sense amplifier 1 for read is performed (step S2). If the threshold voltage of the memory cell is smaller than the reference voltage Vref (the voltage corresponding to the reference current Iref), the write operation takes place again. The verify operation/write operation are repeated until the threshold voltage of the memory cell is not less than the reference voltage Vref, and writing is ended when the threshold voltage of the memory cell is larger than the reference voltage Vref (step S3). The pulse width of the write control signal A at this time is chosen sufficiently narrow in order to make the dispersion of the threshold distribution small. Writing is continued up to the timing indicated by "pass" in the curve for (B) in the timing chart in FIG. 5. The reference current Iref' in this case is set so as to have the corresponding threshold Vref' of the memory cell to be lower than the reference voltage Vref. By so doing, it is possible to write data at high speed without requiring the verify operation by the sense amplifier 1 for read until the threshold voltage of the memory cell reaches Vref', thereafter to repeat alternately the writing with a small pulse width and the verify operation, and ends the writing when the threshold reaches precisely Vref.

Figure 6:
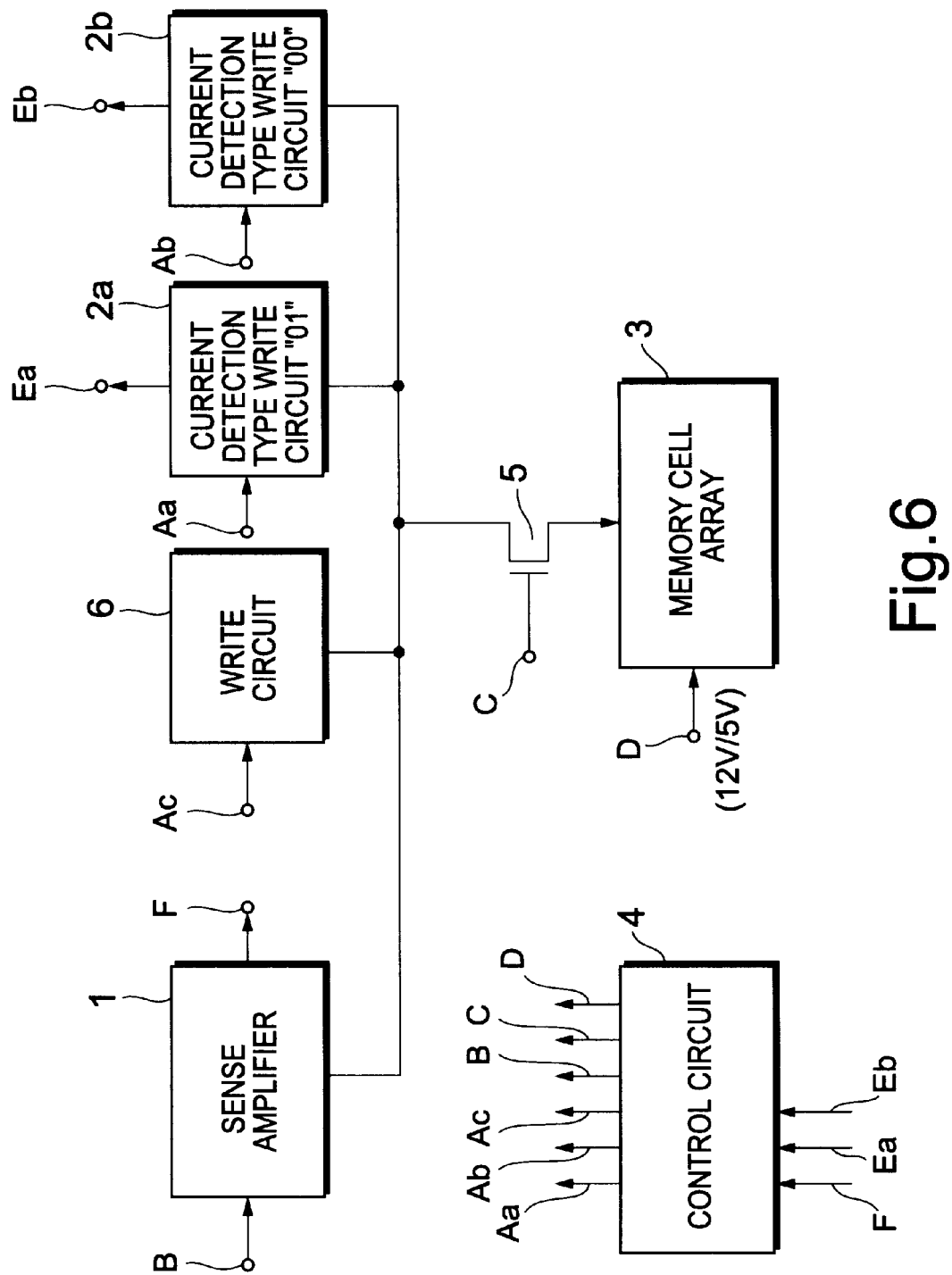
FIG. 6 is a block diagram for a second embodiment of the present invention.

Next, FIG. 6 shows a block diagram of a second embodiment of this invention, where the parts equivalent to those in FIG. 2 are indicated by the same symbols. This embodiment shows an example of a nonvolatile semiconductor memory device by which it is possible to perform multilevel mode write and read. It will be assumed that the memory cell array 3 is a nonvolatile semiconductor memory of, for example, four values, and defined that the erase level with the lowest threshold is a data "11", and the write levels are "10", "01", and "00" in the ascending order of the threshold.

Figure 8:
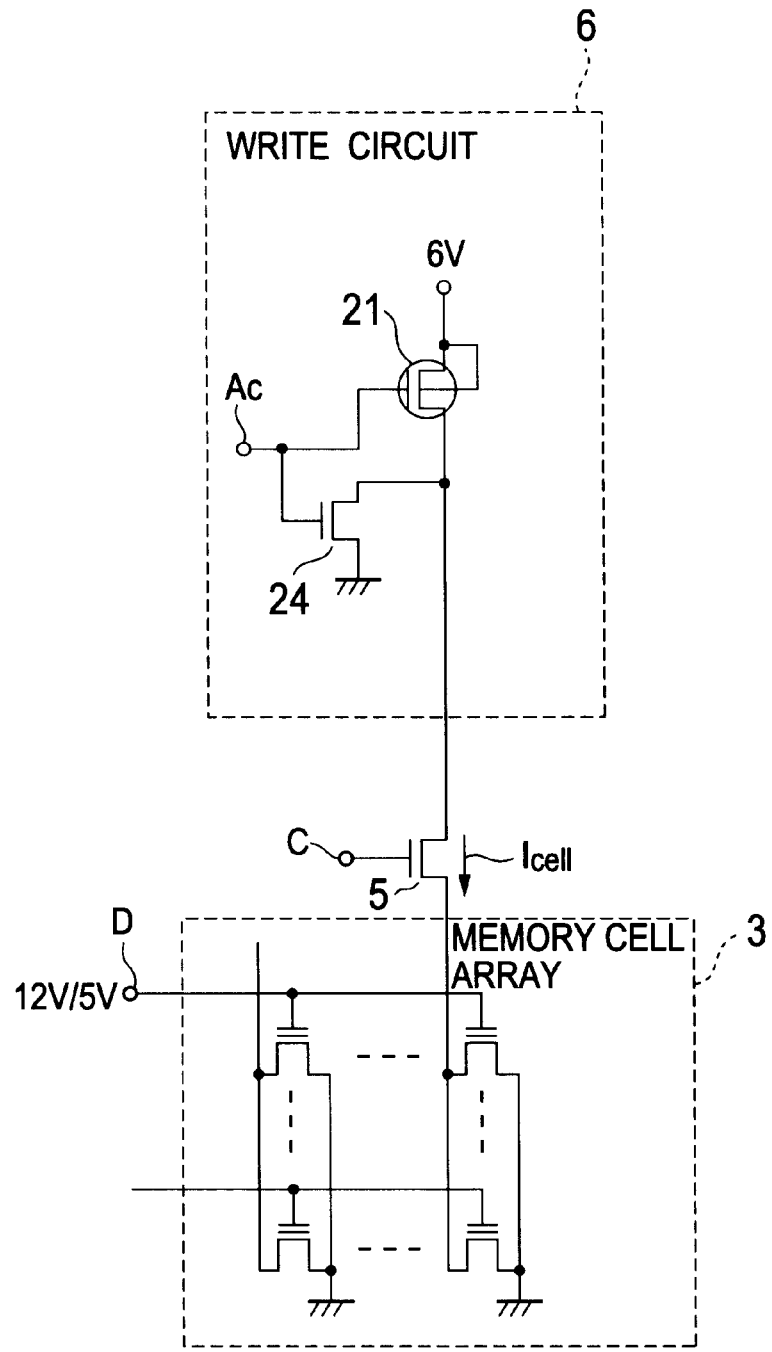
FIG. 8 is a circuit diagram of the write circuit in FIG. 6.

Referring to FIG. 6, this device is provided with a sense amplifier 1, a current detection type write circuit 2a with level "01", a current detection type write circuit 2b with level "00", a memory cell array 3, a control circuit 4, a normal write circuit 6, and a column selection transistor 5. Here, the sense amplifier 1 and the current detection type write circuits 2a and 2b have identical configurations with those of the sense amplifier 1 and the current detection type write circuit 2, respectively, in FIG. 2, and the write circuit 6 is the same as the normal write circuit. However, this device does not have a sense amplifier and a comparator circuit for comparing the reference current Iref' and the drain current Icell, as shown in FIG. 8.

It is to be noted that the reference current Iref of the sense amplifier 1 in this embodiment is set at the current value corresponding to the threshold $V_{10}$ that corresponds to the smallest write level "10" among the multilevels except for erase level "11". Further, in this embodiment, the reference current of the current detection type write circuit 2a is set at the current value corresponding to the threshold $V_{01}$ of the write level "01", and the reference current of the current detection type write circuit 2b is set at the current value corresponding to the threshold V00 of the write level "00". The symbols Aa to Ac are write control signals, and Ea and Eb are matching detection signals.

Figure 7:
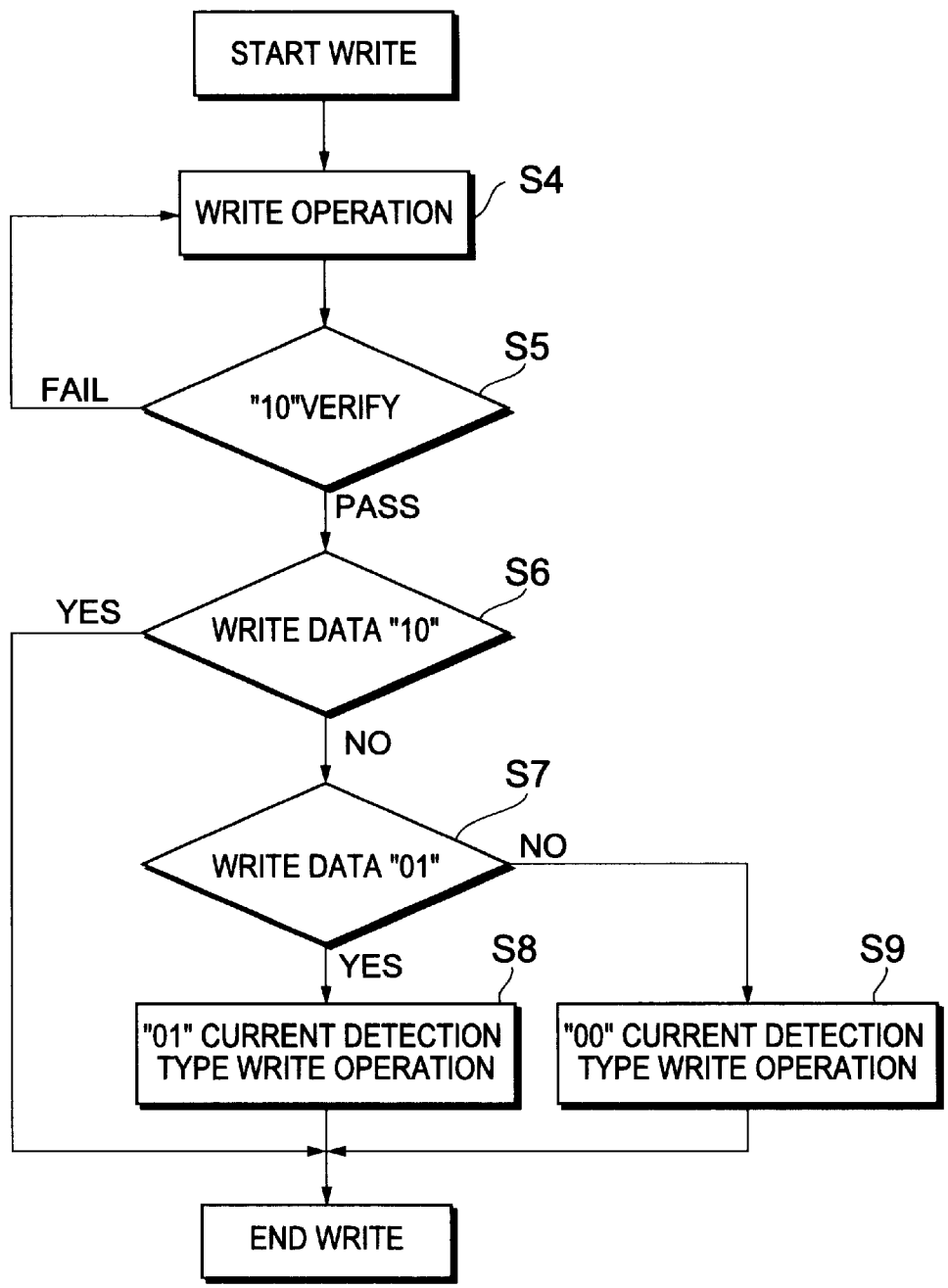
FIG. 7 is a flow chart showing the operation of the various blocks in FIG. 6.

FIG. 7 is a flow chart showing the operation of this embodiment as well as the control operation of the control circuit 4. Referring to FIG. 7, first, a write operation is performed for an appropriate write time by controlling the write circuit 6 (step S4). Next, the verify operation of the "10" data is carried out using the sense amplifier 1 for read (step S5). The write operation with appropriate write time and the verify operation by the sense amplifier 1 for read are repeated alternately until the verify operation lets it pass. Since, however, the writing takes place at high speed in this case, the write pulse width is restricted to a small value to such an extent that there will not occur an overshoot of writing.

When the pass status is gained by the "10" verify operation as a result of repeated operation in the above, writing is ended there if the write data is "10". If the write data is "01" or "00", the current detection type write operation is performed further using separately the current detection type write circuits 2a or 2b (steps S6 to S9).

According to this embodiment, writing is performed precisely, in the initial period of write where the write rate is high, by the repetition of the write operation and the verify operation using the sense amplifier 1. Since a write current detection type write circuit, for which it is not possible to precisely control the end point of write, is not employed in this embodiment, it is possible to precisely set the threshold to the predetermined value.

When further write is required in the post stage of write, writing is performed using the write current detection type write circuits. Since the write speed is deteriorated in the post stage of write a, precise write is secured by employing a write current detection type write circuit provided with a comparator circuit. Since the switching to the verify operation which uses the sense amplifier 1 is not performed in this embodiment and there is no need for providing a time for verify operation separately from the write time, it is possible to reduce the write time. In this way, it is possible to perform a write operation at a high speed and with high reliability even for the case of a multilevel writing.

In this embodiment, it is also possible to write a plurality of values on the lower side of the threshold, for example, "10" and "01", by means of steps S4 and S5 in FIG. 7, and write only the value "00" with high threshold by means of step S9.

Figure 9:
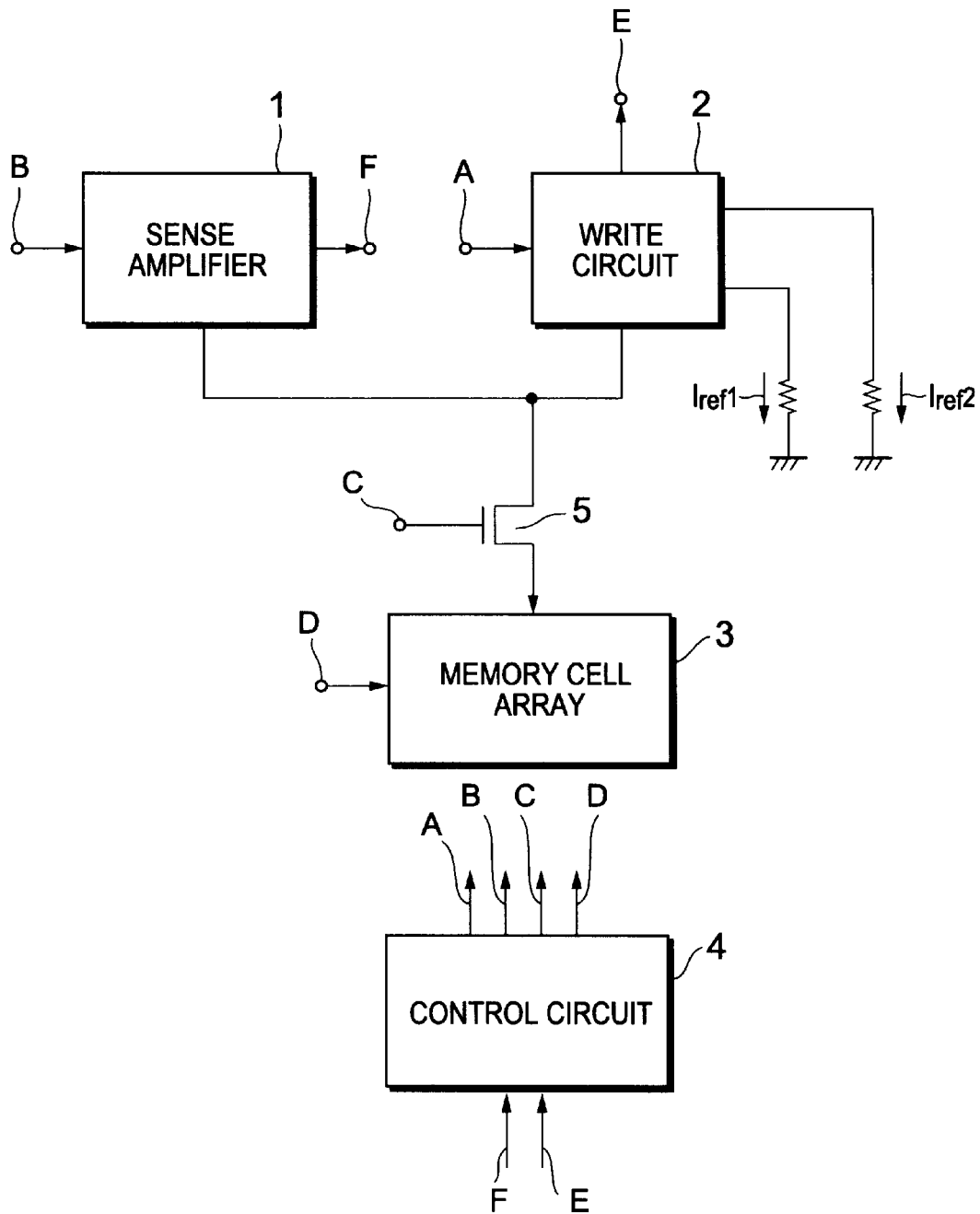
FIG. 9 is a block diagram for a third embodiment of the present invention.

FIG. 9 is a block diagram showing a third embodiment of this invention. It shows a variant of the case in FIG. 6, and the equivalent components as in FIG. 6 are indicated by identical symbols. In this embodiment, the write levels are defined in the ascending order "10", "01", and "00" the same as in the second embodiment.

In this embodiment, the current detection type write circuit 2 shown in FIG. 2 is employed basically as the write circuit 2, but Iref1 and Iref2 corresponding to "01" and "00" are employed as the reference currents, and these reference currents are switched corresponding to the steps S8 and S9 in FIG. 7. In the write processing of step S4 in FIG. 7, these reference currents are not made use of. With this constitution, the configuration of the write circuit can be shared for all write operations, so that the hardware scale can be reduced. The operation of the control circuit 4 in this case is the same as that shown in FIG. 7.

According to the present invention, writing with precise control of the threshold is performed by carrying out a high speed write using the current detection type write system up to a midpoint of writing, and then by repeating "write with a short pulse" and "verify operation with a sense amplifier" in the post stage of the write. By so doing, there is obtained an effect of reducing the dispersion in the threshold of the memory cell after write while maintaining the advantage of high speed write of the current detection type write system.

Moreover, according to the present invention, it is also possible to precisely control the threshold by performing write through repetition of "write with a short pulse" and "verify operation with a sense amplifier" up to a midpoint of writing, then performing write at high speed by the current detection type write system without additional provision for a detection time in the post stage of the write where the write speed is reduced. In this case, it is also possible to secure the effect of reducing the dispersion in the threshold of the memory cell after write while maintaining the advantage of the high speed write of the current detection type write system.

It is apparent that the present invention is not limited to the above embodiments, but may be modified and changed without departing from the scope and spirit of the invention.

What is claimed is:

1. A nonvolatile semiconductor memory device comprising:
    a nonvolatile semiconductor memory cell array,
    write current detection-type write means for performing a threshold verification while performing a write operation by monitoring a writing cell current to a memory cell of said memory cell array;
    sense amplifier means for read for performing the threshold verification of the memory cell while monitoring an on-current of said memory cell; and
    control means for switching between the verification by said write current detection-type write means and the verification by said sense amplifier means for read,
    wherein said write current detection-type write means includes:
        means for generating and supplying said writing cell current for said memory cell based on a write voltage; and
        first comparator means for comparing said writing cell current against a first predetermined reference value,
    wherein said control means performs a writing by repeating said write operations by said current detection-type write means and said threshold verification by said sense amplifier means for read when matching by said first comparator means is detected,
    wherein said sense amplifier means includes a second comparator means for comparing said on-current of said memory cell against a second predetermined reference value and said control means ends said writing operation in response to matching detection by said second comparator means of said sense amplifier means while performing writing by the repetition of said writing operations by said write current detection-type write means and said verifications by said sense amplifier means for read.

2. The nonvolatile semiconductor memory device as claimed in claim 1, wherein said second predetermined reference value is set to be smaller than said first predetermined reference value.

3. A nonvolatile semiconductor memory device comprising:
    a nonvolatile semiconductor memory cell array for performing a multilevel write and a read;
    write means for performing a write to a memory cell of said memory cell array;
    sense amplifier means for read for performing a threshold verification of the memory cell while monitoring the on-current of said memory cell; and
    control means for controlling so as to write at least one value out of said multilevels by the repetition of write by said write means and a verification operation by said sense amplifier for read, and then write the rest of said values other than said one value of said multilevels by said write means,
    wherein said sense amplifier means includes comparator means for comparing a cell current read out against the reference value corresponding to said one value, and said control means controls so as to write said rest of said values other than said one value in response to matching detection of said comparator means.

4. The nonvolatile semiconductor memory device as claimed in claim 3, wherein said write means includes:
    cell current supply means for generating and supplying a cell current for said memory cell based on a write voltage; and
    comparator means for comparing the cell current against predetermined reference values corresponding to said rest of said values other than said one value, and said control means causes said cell current supply means and said comparator means to perform at the time of writing said rest of said values other than said one value.

5. A nonvolatile semiconductor memory device comprising:
    a nonvolatile semiconductor memory cell array;
    a first writing current detection-type writing circuit including a first writing circuit receiving a first voltage and supplying a writing cell current based on said first voltage to said memory cell array and a first verification circuit comparing said writing cell current with a first predetermined reference current and generating a first control signal when said writing cell current is said first predetermined reference current; and
    a sense amplifier receiving a second voltage, supplying an on-current based on said second voltage to said memory cell array in response to said first control signal, and including a second verification circuit for comparing said on-current with a second predetermined reference current and for generating a second control signal when said on-current is said second predetermined reference current.

6. The nonvolatile semiconductor memory device as claimed in claim 5, further comprising:
    a control circuit deactivating said first writing current detection-type writing circuit and activating said sense amplifier in response to said first control signal.

7. The nonvolatile semiconductor memory device as claimed in claim 6, wherein said control circuit deactivates said first writing current detection-type writing circuit and said sense amplifier in response to said second control signal indicating that said on-current is equal to said second predetermined reference current, and deactivates said sense amplifier and activates said first writing current detection-type writing circuit in response to said second control signal indicating that said on-current is not equal to said second predetermined reference current.

8. The nonvolatile semiconductor memory device as claimed in claim 5, wherein said first predetermined reference current has a larger absolute value than said second predetermined reference current.

9. The nonvolatile semiconductor member device as claimed in claim 7, wherein said control circuit deactivates said first writing current detection-type writing circuit after a predetermined short time and activates said sense amplifier after said control circuit deactivates said sense amplifier and activates said first writing current detection-type writing circuit in response to said second control signal indicating that said on-current is not equal to said second predetermined reference current.

10. The nonvolatile semiconductor memory device as claimed in claim 7, wherein a writing operation of said first writing current detection-type writing circuit and a verifying operation of said sense amplifier are repeated until said first writing current detection-type writing circuit and said sense amplifier are deactivated in response to said second control signal indicating that said on-current is equal to said second predetermined reference current.

11. A nonvolatile semiconductor memory device comprising:

a nonvolatile semiconductor memory cell array;

a first writing current detection-type writing circuit having a first writing circuit receiving a first voltage and supplying a writing cell current based on said first voltage to said memory cell array and a first verification circuit comparing said writing cell current with a first predetermined reference current and generating a first control signal when said writing cell current is said first predetermined reference current;

a sense amplifier receiving a second voltage, supplying an on-current based on said second voltage to said memory cell array in response to said first control signal, and including a second verification circuit for comparing said on-current with a second predetermined reference current and generating a second control signal when said on-current is said second predetermined reference current;

a second writing current detection-type writing circuit having a second writing circuit receiving a third voltage and supplying a writing cell current based on said third voltage to said memory cell array and a third verification circuit comparing said writing cell current with a third predetermined reference current and generating a third control signal when said writing cell current is said third predetermined reference current; and a control circuit activating said first writing current detection-type writing circuit deactivating said first writing current detection-type writing circuit and activating said sense amplifier in response to said first control signal, deactivating said sense amplifier and activating said first writing current detection-type writing circuit in response to said second control signal indicating that said on-current is not equal to said second predetermined reference current, and deactivating said first writing current detection-type writing circuit and said sense amplifier in response to said second control signal indicating that said on-current is equal to said second predetermined reference current so that said memory cell array is set to have a first threshold voltage of a smallest written level, said control circuit activating said second writing current detection-type writing circuit in response to said second control signal indicating that said on-current is equal to said second predetermined reference current, and deactivating said second writing current detection-type writing circuit in response to said third control signal indicating that said writing cell current is equal to said third predetermined reference current so that said memory cell array that has been set to have the first threshold voltage is set to have a second threshold voltage of a larger written level than said smallest written level.

* * * * *